(12) United States Patent
Iwabuchi

(10) Patent No.: US 10,364,901 B2
(45) Date of Patent: Jul. 30, 2019

(54) VACUUM GATE VALVE

(71) Applicant: KITZ SCT CORPORATION, Tokyo (JP)

(72) Inventor: Toshiaki Iwabuchi, Gunma (JP)

(73) Assignee: KITZ SCT CORPORATION, Tokyo (JP)

(*) Notice: Subject to any disclaimer, the term of this patent is extended or adjusted under 35 U.S.C. 154(b) by 0 days.

(21) Appl. No.: 15/793,180

(22) Filed: Oct. 25, 2017

(65) Prior Publication Data

US 2018/0119822 A1    May 3, 2018

(30) Foreign Application Priority Data

Oct. 28, 2016 (JP) .................. 2016-211342

(51) Int. Cl.
| | | |
|---|---|---|
| *F16K 3/02* | (2006.01) | |
| *F16K 3/18* | (2006.01) | |
| *F16K 51/02* | (2006.01) | |
| *F16K 3/314* | (2006.01) | |
| *H01L 21/67* | (2006.01) | |

(52) U.S. Cl.
CPC ............ *F16K 3/184* (2013.01); *F16K 3/0218* (2013.01); *F16K 3/0281* (2013.01); *F16K 3/182* (2013.01); *F16K 3/314* (2013.01); *F16K 51/02* (2013.01); *H01L 21/67126* (2013.01)

(58) Field of Classification Search
CPC ........ F16K 3/184; F16K 3/314; F16K 3/0281; F16K 51/02
USPC ....................................... 251/203
See application file for complete search history.

(56) References Cited

U.S. PATENT DOCUMENTS

| | | | | |
|---|---|---|---|---|
| 5,641,149 A | * | 6/1997 | Ito .............................. | F16K 3/18 251/158 |
| 5,755,255 A | * | 5/1998 | Iwabuchi ................ | F16K 3/184 137/341 |
| 6,082,706 A | * | 7/2000 | Irie ......................... | F16K 51/02 251/158 |

(Continued)

FOREIGN PATENT DOCUMENTS

| | | |
|---|---|---|
| JP | 5490124 | 5/2014 |
| JP | 5655002 | 1/2015 |

(Continued)

*Primary Examiner* — Reinaldo Sanchez-Medina
*Assistant Examiner* — David Colon-Morales
(74) *Attorney, Agent, or Firm* — Wenderoth, Lind & Ponack, L.L.P.

(57) ABSTRACT

A vacuum gate valve includes a valve body open/close drive body provided between opposing housing bodies, a stem of the valve body open/close drive body, and a valve body provided to the stem. The housing bodies each has a piston rod vertically moving by a cylinder mechanism, a cam member of the piston rod, and a cam roller provided in a cam groove formed in the cam member. A spring receiving unit on both sides of the valve body open/close drive body and a spring which causes the spring receiving unit to be disposed in the cam member and resiliently supported between the spring receiving unit and the piston rod are provided. The housing body includes a vertical-movement guiding unit in which the valve body open/close driving body vertically moves between the housing bodies and a stopper by which the valve body open/close drive body is locked at ascending.

12 Claims, 14 Drawing Sheets

(56) References Cited

U.S. PATENT DOCUMENTS

| | | | | |
|---|---|---|---|---|
| 6,095,180 | A * | 8/2000 | Ishigaki | F16K 49/002 137/341 |
| 6,390,449 | B1 * | 5/2002 | Ishigaki | F16K 3/184 251/193 |
| 7,066,443 | B2 * | 6/2006 | Ishigaki | F16K 51/02 251/195 |
| 7,100,892 | B2 * | 9/2006 | Iwabuchi | F16K 3/184 251/187 |
| 8,382,066 | B2 * | 2/2013 | Nagao | F16K 3/184 251/204 |
| 8,474,791 | B2 * | 7/2013 | Ogawa | F16K 3/3165 251/203 |
| 8,800,956 | B2 * | 8/2014 | Ishigaki | F16K 3/16 251/203 |
| 9,404,589 | B2 * | 8/2016 | Ishigaki | F16K 51/02 |
| 9,482,350 | B2 * | 11/2016 | Ishigaki | F16K 3/0281 |
| 9,599,233 | B2 * | 3/2017 | Ishigaki | F16K 27/044 |
| 9,765,897 | B2 * | 9/2017 | Jee | F16K 3/184 |

FOREIGN PATENT DOCUMENTS

| | | |
|---|---|---|
| JP | 5823071 | 11/2015 |
| JP | 5890929 | 3/2016 |

* cited by examiner

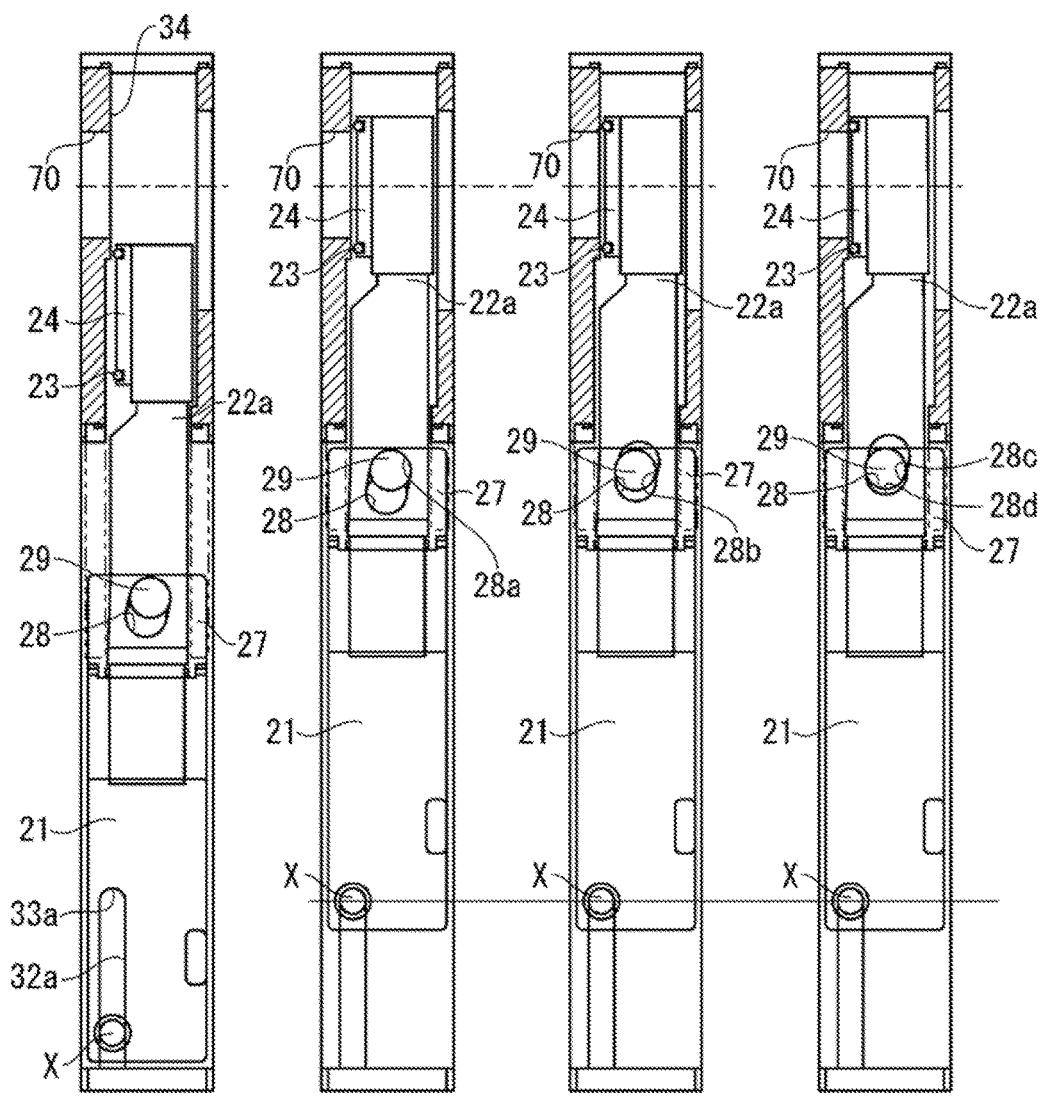

Fig. 13A PRIOR ART
Fig. 13B PRIOR ART
Fig. 13C PRIOR ART
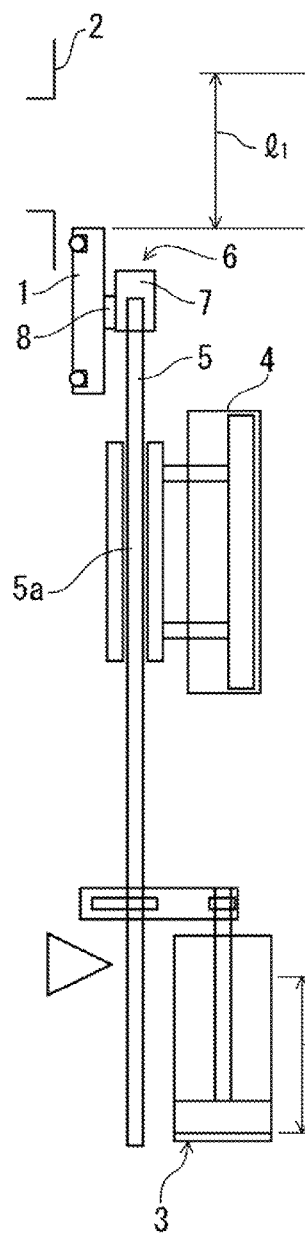
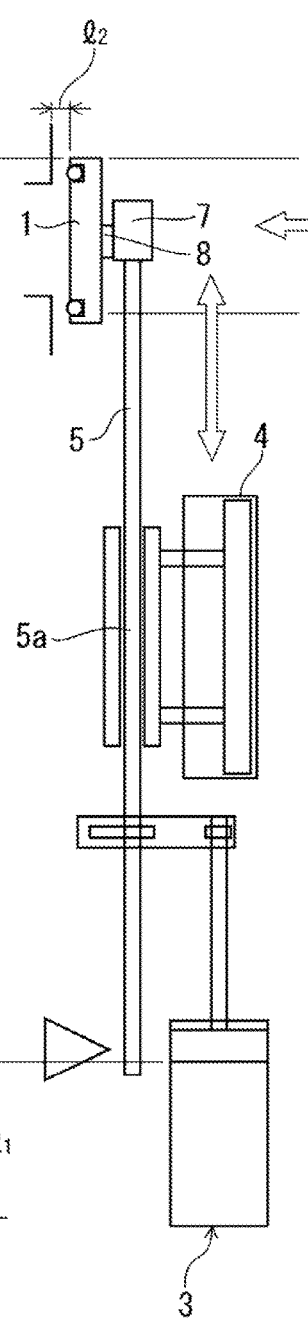
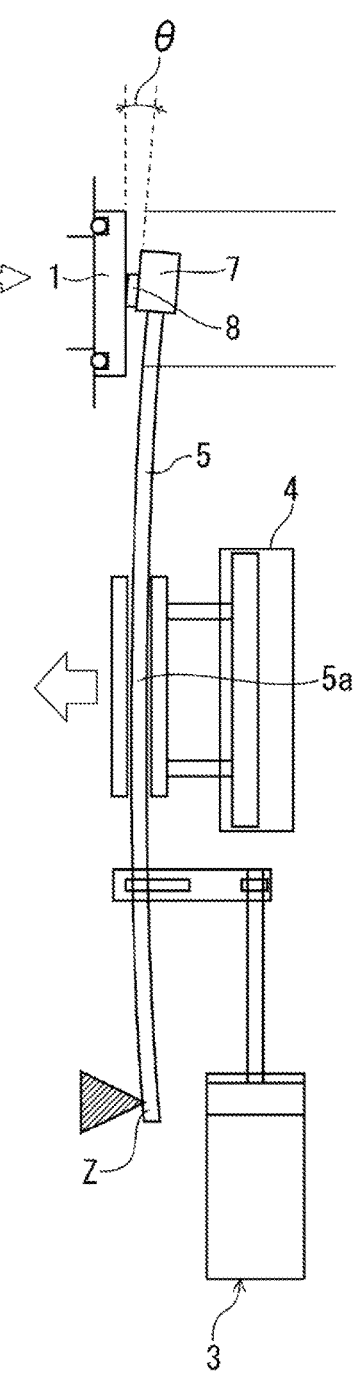

VACUUM GATE VALVE

BACKGROUND OF THE INVENTION

Field of the Invention

The present invention relates to a vacuum gate valve for opening and closing, for example, a vacuum chamber of a semiconductor manufacturing apparatus, for wafer transfer and, in particular, to a gate valve having an open/close mechanism with a significantly less amount of particles occurring from a valve body seal member even if a valve body of the gate valve of this type has a simple structure.

Description of the Related Art

Conventionally, even non-sliding gate valves cannot minimize the amount of particles occurring at the time of operation. Thus, with the advance of semiconductor microfabrication, influences of device failures become quite significant. To address this problem, vacuum gate valves with a minimized amount of occurrence of particles have been strongly desired to be developed.

Examples of conventional vacuum gate valve are specifically described based on FIG. 13 and FIG. 14. First, Japanese Patent No. 5490124 depicted in FIG. 13 discloses a gate valve configured to have a valve body 1 moved in parallel to a body seal surface 2 for fastening. This gate valve is configured of a cylinder 3 which vertically moves the valve body 1 and a cylinder 4 which horizontally moves the valve body 1. When the valve body 1 is raised by the cylinder 3 which vertically moves the valve body 1 to a flow path position (movement by a distance $l_1$), the valve body 1 stops ascending. By the cylinder 4 which horizontally moves (movement by a distance $l_2$ between the valve body 1 and the body seal surface 2), a center portion 5a of a valve rod 5 is horizontally opened or closed to open or close the body seal surface 2 and the valve body 1 substantially in parallel. In this gate valve, the valve rod 5 has a long both-ends-supported-beam structure. Thus, when the center portion 5a of the valve rod 5 is pushed by the cylinder 4, if the valve rod 5 has a large flexure, a flexure angle θ occurs on a center portion 5a side from a support Z and on a valve body 7 side from the center portion 5a, thereby disabling the valve body 1 to be completely closed in parallel to the body seal surface 2. Thus, the amount of occurrence of particles cannot yet be reduced.

To address the problem in Japanese Patent No. 5490124, Japanese Patent No. 5655002 suggests a technology which includes a valve body support structure. This structure has a swing mechanism 6 which allows a swing of the valve body 1 which uniformly presses the body seal surface 2. A valve body support 7 is attached on a back side of the body seal surface 2, and the valve body 1 with the valve body support 7 attached with the valve rod 5 and a valve body support joint unit 8 are swingably attached via the swing mechanism 6. With a swing of the valve body 1 and the valve body support joint unit 8, the slight flexure angle θ between the body seal surface 2 and the valve body 1 occurring due to a flexure of the valve rod 5 is eliminated to allow the valve body 1 to be pressed in parallel to the body seal surface 2.

Next, Japanese Patent No. 5823071 depicted in FIG. 14 discloses a gate valve configured to have a valve body 10 moved in parallel to a body seal surface 11 for fastening. In this gate valve, when the valve body 10 is raised by a cylinder 12 which vertically moves the valve body 10 to a flow path position (movement by a distance $l_{10}'$), the valve body 10 stops ascending. Furthermore, when a piston 13 ascends (by a distance $l_{11}'$), a center portion 15a of a valve rod 15 is horizontally opened or closed by a parallel link mechanism 14 (movement by a distance $l_2'$ between the valve body 10 and the body seal surface 11), and the body seal surface 11 and a valve body seal member 16 are opened and closed substantially in parallel. In this gate valve, the valve rod 15 has a long both-ends-supported-beam structure. Thus, when the center portion 15a of the valve rod 15 is pushed by the parallel link mechanism 14, if the valve rod 15 has a large flexure, as depicted in FIG. 14, a flexure angle θ occurs on a center portion 15a side from a support Z and on a valve body 10 side from the center portion 15a, thereby disabling the valve body 10 to be completely closed in parallel to the body seal surface 11. Thus, the amount of occurrence of particles cannot yet be reduced.

To address the problem in Japanese Patent No. 5823071, Japanese Patent No. 5890929 suggests a technology in which the valve body support 17 is attached to the valve rod 15 and the valve body support 17 is attached to a back surface of the valve body 10. With the valve body 10 slightly warped for attachment, rotation moment is provided to both ends of the valve body 10 in a longitudinal direction to allow the valve body 10 to be completely closed in parallel to the body seal surface 11. In this case, the attachment structure is such that a gap is provided between the valve body 10 and the valve body support 17. Thus, as with Japanese Patent No. 5655002, with a swing of the valve body 10, the slight angle between the body seal surface 11 and the valve body 10 occurring due to warpage of the valve rod 15 is eliminated to allow the valve body 10 to be pressed in parallel to the body seal surface 11.

BRIEF SUMMARY OF THE INVENTION

However, according to Japanese Patent No. 5490124 and Japanese Patent No. 5823071, the valve body cannot be completely closed in parallel to the body seal surface, and thus the amount of occurrence of particles cannot yet be reduced. To address the problem in Japanese Patent No. 5490124 and Japanese Patent No. 5823071, Japanese Patent No. 5655002 and Japanese Patent No. 5890929 are suggested. However, even in these patent gazettes, a swing unit between the valve body and the valve support swings due to warpage of the material of the valve support. Thus, the technologies in these patent gazettes have a problem such that the swing unit is hard to swing if its stiffness is high and, if its stiffness is low, particles tend to occur from a connection surface between the valve body and the valve support. Thus, these technologies lack stability as a vacuum gate valve, and may not achieve a reliable and stable gate valve with respect to the occurrence of particles.

The present invention was developed to solve the above problems. The present invention is to provide a vacuum gate valve with excellent stability and compactness and also with the occurrence of particles minimized.

To achieve the above object, one aspect of the present invention is directed to a vacuum gate valve including a valve body open/close drive body provided between longitudinally-elongated housing bodies opposingly disposed, a stem fixed to an upper portion of the valve body open/close drive body, and a long rectangular-shaped valve body having a valve body seal member at an upper end of the stem, the housing bodies each having a piston rod vertically moving by a cylinder mechanism, a cam member fixedly attached to an upper portion of the piston rod, and a cam roller provided in a long-hole cam groove formed in the cam member and at upper portions on both sides of the valve body open/close drive body and guided to the cam groove so as to be able to swing, the valve body open/close drive body having, on each of the both sides, a spring receiving unit disposed at a lower portion of the cam member, and a spring resiliently supported between the spring receiving unit and the piston rod, and a lower position of each of the housing bodies and the valve body open/close drive body having a stopper unit locking the valve body open/close drive body ascending between the housing bodies, and a support when a pendulum motion is made between the housing bodies, wherein the piston rod ascends, the support locks the stopper unit, and the piston rod further ascends to cause the spring to push the cam roller in a flow path side direction as being contracted, a valve is closed by the pendulum motion, a valve seat and a valve body are set so as to be parallel to each other at a position where the valve body seal member makes contact with the valve seat, and the valve body seal member is fastened and compressed to cause the stem to be warped to completely close the valve body seal member nearly in parallel to the valve seat.

According to another aspect of the present invention, the valve body open/close drive body has a rigid structure not warped when a load at valve closing acts.

According to still another aspect of the present invention, with an attachment shaft part provided above the piston rod inserted through an opening of the spring receiving unit, the cam member and the attachment shaft part are fixedly attached via a bolt.

According to yet another aspect of the present invention, the spring fitting in the attachment shaft part has an upper end in contact with the spring receiving unit and an another end in contact with an upper end of the piston rod.

According to yet another aspect of the present invention, the spring receiving unit is rotatably provided to the valve body open/close drive body so as to allow angular adjustment.

According to yet another aspect of the present invention, with a rotation shaft having a rotation groove in the spring receiving unit being inserted into an insertion hole in the valve body open/close drive body, the rotation groove is rotatably guided with a set screw fixedly attached to the valve body open/close drive body.

According to yet another aspect of the present invention, a vertical-movement guide groove is formed at a lower position of the housing body, a support stopper at an upper end of the vertical-movement guide groove is provided to serve as the stopper unit, and the support is a support rod.

According to yet another aspect of the present invention, a support as a rod receiving unit is provided at a lower end of the valve body open/close drive body, and the stopper unit is a stopper rod provided to the housing bodies.

According to yet another aspect of the present invention, a cylinder base is coupled to a lower portion of the housing body, the cylinder base is provided with a flow path which supplies and exhausts air, and the flow path communicates a cylinder chamber of the cylinder mechanism.

According to yet another aspect of the present invention, an upper end of the stem is fixedly attached at a center position of the valve body via a bolt.

According to yet another aspect of the present invention, a position of the support of the valve body open/close drive body is set so as to be straight below the valve seat on a valve box side to be pressed and completely closed by the valve body seal member of the valve body.

According to one aspect of the present invention, a compact vacuum gate valve as a whole can be manufactured, a desire for size reduction can be attained. Furthermore, the stem is warped to allow the valve body seal member to be uniformly fastened to the valve seat. Thus, an occurrence of particles can be minimized, influences of device failures can be solved, and a vacuum gate valve with excellent stability can be provided.

In particular, even with warpage of the stem, closing with the valve body and the valve seat parallel to each other can be made. Thus, a conventional integrated valve body without a valve body support can be used, with easy processing at low price. Thus, a gate valve having an open/close mechanism with a less amount of particles occurring can be obtained.

According to another aspect of the present invention, the valve body open/close drive body is not warped even with a load at the time of valve closing. In particular, the amount of warpage of the stem can be significantly decreased.

According to still another aspect of the present invention, the cam member can be reliably and stably driven so as to be able to vertically move at an upper position inside the housing body. Thus, the amount of particles occurring in a gate valve open/close mechanism can be minimized.

According to yet another aspect of the present invention, the functions of the spring can be sufficiently exerted stably at an upper position of the paired housing bodies in a uniformed state.

According to yet another aspect of the present invention, the angle of the spring receiving unit can be adjusted. Thus, the contact surface of the spring receiving unit can be adjusted so as to be parallel to the lower surface of the cam member, thereby allowing the contact surface and the lower surface to make a flat contact with each other. Thus, the valve body open/close drive body is reliably retained at the full-open position in a pendulum motion.

According to yet another aspect of the present invention, actuation of the valve body open/close drive body can be reliably performed. Thus, the amount of occurrence of particles can be decreased.

According to yet another aspect of the present invention, the valve body open/close drive body is caused to reliably ascend or descend in a vertical state at the time of ascending to the stopper unit, and then the valve body and the valve seat are reliably actuated nearly in a parallel state by the valve body open/close drive body by taking the stopper unit as a support.

According to yet another aspect of the present invention, the paired housing bodies and the valve body open/close drive body can be assembled to be compact. Also, supply and exhaustion of air can be performed by using the cylinder base, which contributes to compactability.

According to yet another aspect of the present invention, the stem and the valve body have an integrated structure, and thus the structure can be simplified, and the occurrence of particles can also be inhibited.

According to yet another aspect of the present invention, the valve body makes a pendulum motion by taking the stopper unit as a support, the pendulum motion reaches an uppermost point when the valve body reaches a seal position. Thus, a vertical motion of the valve body by a pendulum motion is minimum, and thus the amount of occurrence of particles can be minimized.

BRIEF DESCRIPTION OF THE DRAWINGS

FIG. 11A is a side view of a partially notched section depicting a state in which the valve body is at the lower position with the vacuum gate valve being in the full-open state;

FIG. 11B is a side view of a partially notched section depicting a state in which the valve body is at the upper position with the vacuum gate valve being in the full-open state;

FIG. 11C is a side view of a section depicting a state in which the valve body is in a vertical state;

FIG. 11D is a side view of a section depicting the fully-closed state;

FIG. 13A to FIG. 13C are diagrams depicting an example of a conventional vacuum gate valve for concept description.

DETAILED DESCRIPTION OF THE INVENTION

Figure 6:
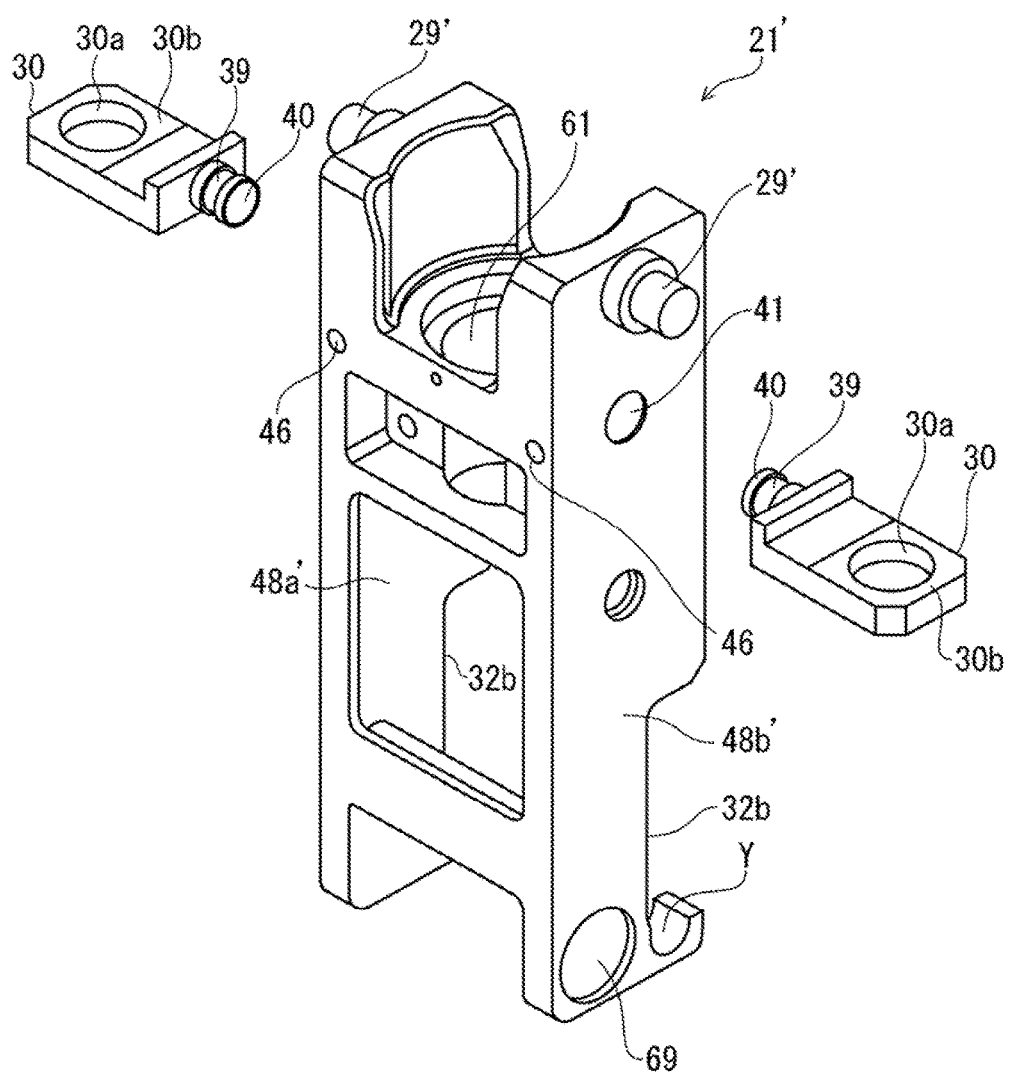
FIG. 6 is a perspective view depicting a state in which the valve body open/close drive body and a spring receiving unit are separated from each other.

Preferred embodiments of the vacuum gate valve in the present invention are described in detail based on the drawings. FIGS. 1A to 1D, 2, 5A to 5C, 8 to 10, and 11A to 11D depict an embodiment (first embodiment) of the present invention, and FIGS. 3 and 6 depict another embodiment (second embodiment) of the present invention. The first embodiment and the second embodiment are different from each other only in the presence or absence of a vertical-movement guide groove 32a, which will be described further below, and stopper units 33a and 33b and supports X and Y, and share other structures in common.

As depicted in FIGS. 2, 3, and 8 to 10, a valve body open/close drive body 21 of the present invention is provided between longitudinally-elongated housing bodies 20 opposingly disposed. The housing bodies 20 are actuators of the gate valve of the present invention, each have a longitudinally-elongated rectangular parallelepiped shape, are disposed symmetrically in a lateral direction of the valve body open/close drive body 21 in a compact manner. The valve body open/close drive body 21 ascends or descends between the housing bodies 20 on both sides integrally with a valve body 24 and a stem 22 to open or close a flow path. As depicted in FIGS. 2, 3, and 8 to 10, with the housing bodies 20 as two columns integrated on both sides of the ascending or descending valve body open/close drive body 21, the gate valve of the present invention is accommodated in a valve box (not depicted) in a compact manner.

As depicted in FIGS. 2, 3, 4A and 4B, and 5A to 5C, the valve body open/close drive body 21 (21') has two side plate units 48 (48a (48a'), 48b (48b')) on a lower side, and has a rigid structure not warped when a load at valve closing acts, which will be described further below. On both sides above these side plate units 48, spring receiving units 30 are provided toward a lateral direction. On these spring receiving units 30, as will be described further below, loads of the valve body 24, the stem 22, and the valve body open/close drive body 21 act, and also resilient forces of springs 31 act at valve opening or closing. Thus, the spring receiving units 30 are required to have a strength to the extent of being capable of resisting a predetermined load with respect to the valve body open/close drive body 21. Any structure of the spring receiving units 30 provided with this strength can be selected. In a full-open state, the valve body open/close drive body 21 is retained by left and right cam grooves 28 and cam rollers 29, the springs 31, and the spring receiving units 30 as being oriented at a full-open position of a pendulum motion, which will be described further below. On an outer surface side of each side plate unit 48, a resin-made thrust bearing member 69 is provided so that the outer surface side of the side plate unit 48 supports sliding and guiding with respect to an inner side surface 20a of the housing body 20.

As depicted in FIG. 6, each spring receiving unit 30 is rotatably provided to the valve body open/close drive body 21 (21') so as to allow angular adjustment. Although FIG. 6 depicts the second embodiment of the present invention, the same goes for the first embodiment. It is possible to select any angular adjustment mechanism in which the angle of a contact surface 30b of the spring receiving unit 30 with respect to a horizontal direction is adjustable and the contact surface 30b and a lower surface 27a of a cam member 27, which will be described further below, can make flat contact (surface contact) with each other, with the direction of the contact surface 30b and the direction of the lower surface 27a being set parallel to each other.

The spring receiving unit 30 has a screwed structure as described below. Specifically, with a rotation shaft 40 having a rotation groove 39 in the spring receiving unit 30 being inserted into an insertion hole 41 in the valve body open/close drive body 21, the rotation groove 39 is rotatably guided and fixedly attached to the valve body open/close drive body 21 (21') with a set screw 42. At assembling, in FIGS. 5A to 5C and 6, the rotation shaft 40 of the spring receiving unit 30 is inserted into the insertion hole 41, and the (rotation) angle of the contact surface 30b with respect to the valve body open/close drive body 21 (including the side plate unit 48) is kept to be an angle at which the contact surface 30b makes parallel surface contact with the lower surface 27a of each of the left and right cam members 27 (an angle in a valve-open orientation in a pendulum motion as depicted in FIGS. 11A and 11B, which will be described further below). In this state, when a set screw 42 (FIG. 5B) is screwed into a screw hole 46, the tip of the set screw 42 hits the rotation groove 39 to cause the rotation shaft 40 to be press-fitted to the valve body open/close drive body 21, thereby causing the spring receiving unit 30 to be fixedly attached to the valve body open/close drive body 21 at a desired angle. Also, with the spring receiving unit 30 fixedly attached at this angle, this valve body open/close drive body 21 is attached to the housing bodies 20. After the contact surface 30b and the lower surface 27a are assembled in a surface contact state, the valve body open/close drive body 21 becomes in a state in which its orientation is reliably retained as being in a valve-open orientation in a pendulum motion, which will be described further below.

Figure 2:
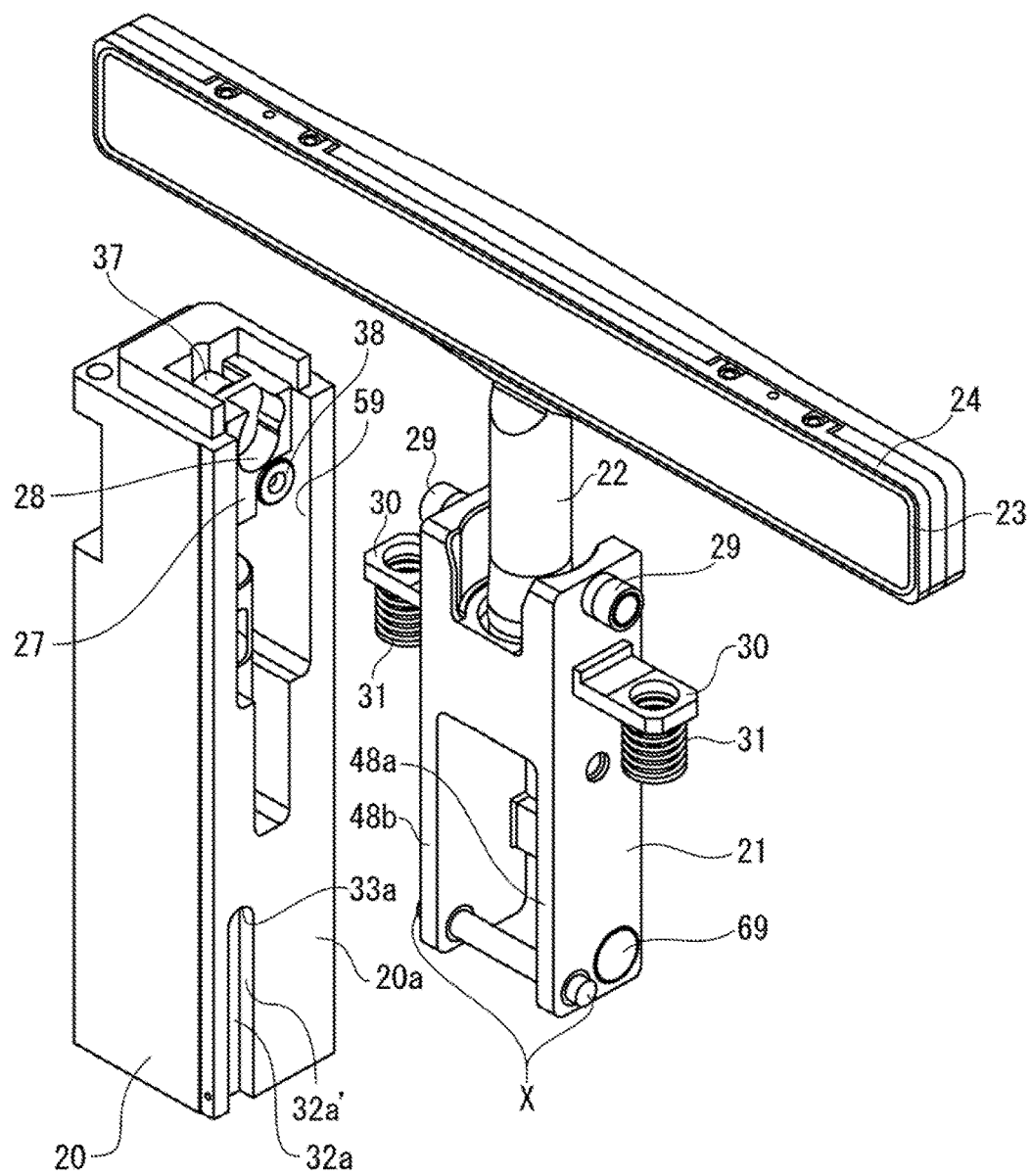
FIG. 2 is a perspective view depicting an example of a state in which one housing body and a valve body open/close drive body are separated from each other.
Figure 3:
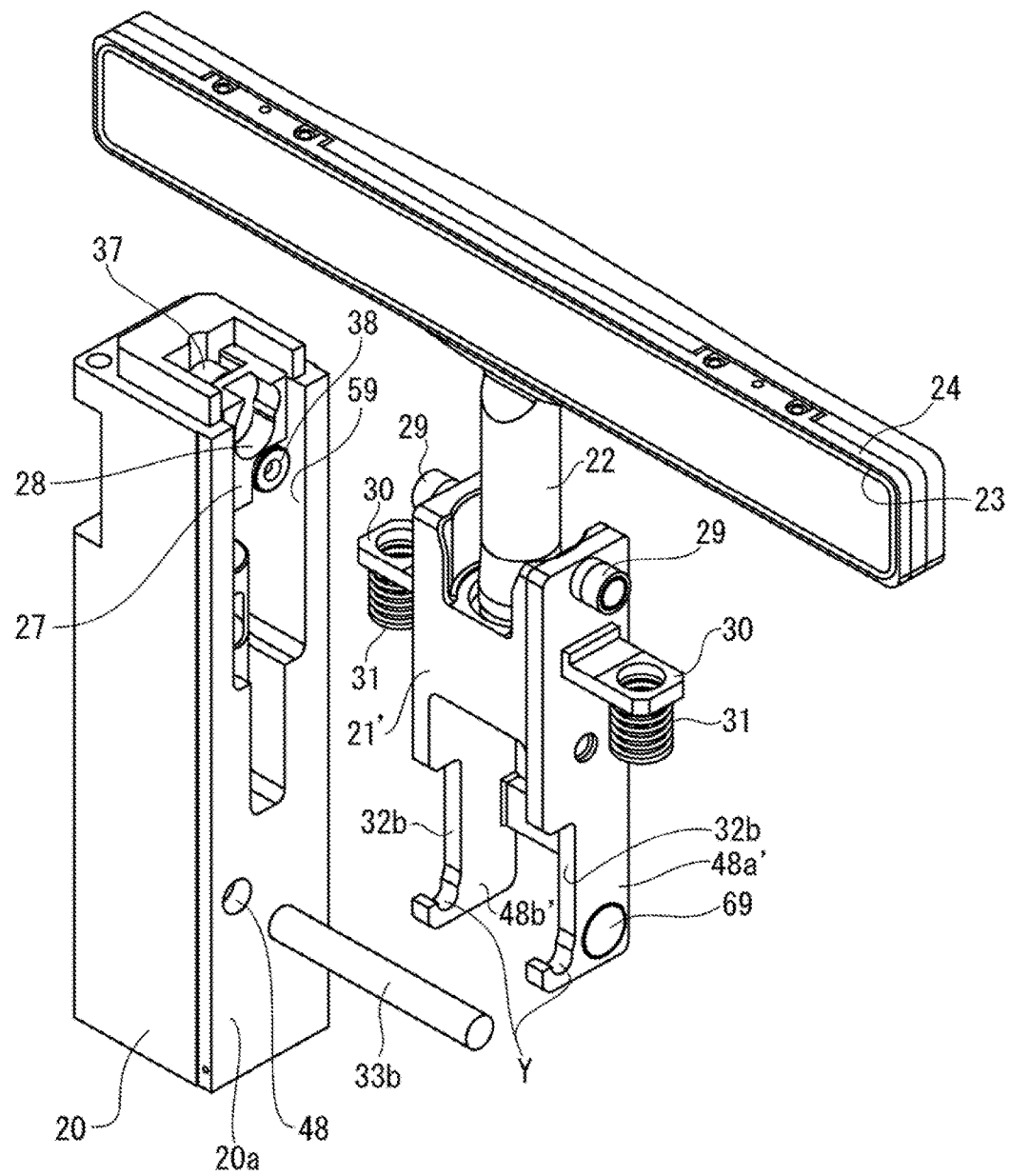
FIG. 3 is a perspective view depicting another example of the state in which one housing body and the valve body open/close drive body are separated from each other.
Figure 4A:
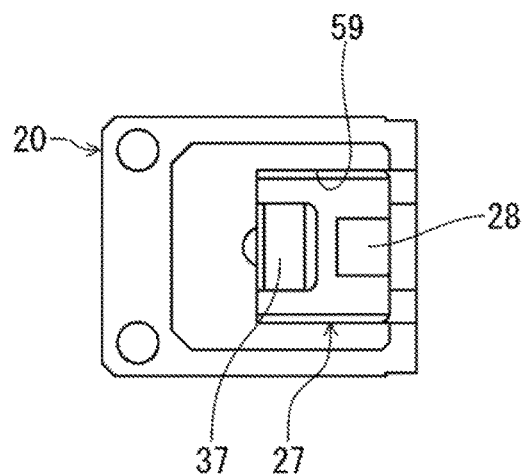
FIG. 4A is a plan view of the housing body.
Figure 4B:
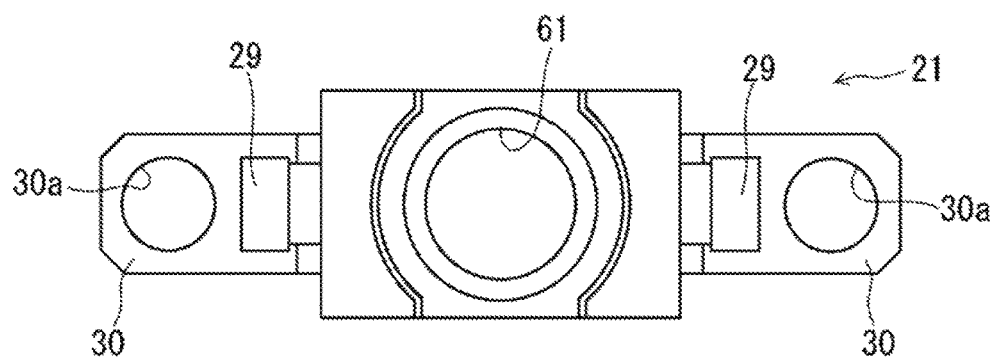
FIG. 4B is a plan view of the valve body open/close drive body.
Figure 5A:
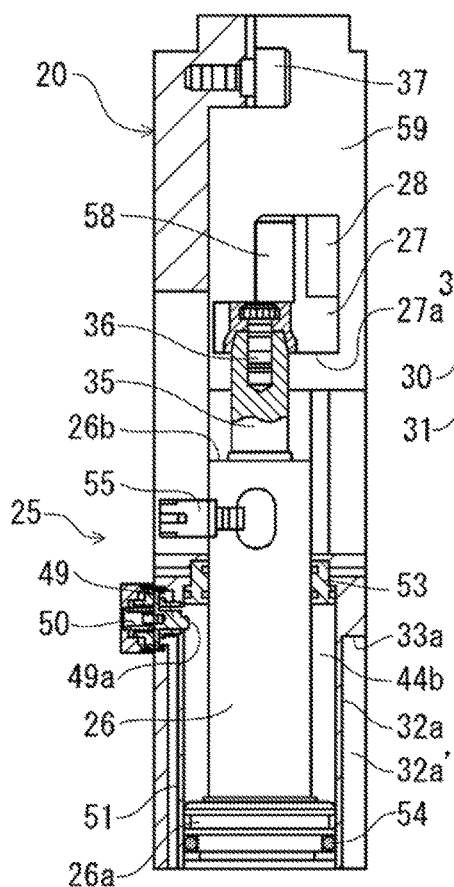
FIG. 5A is a sectional view of the housing body.
Figure 5B:
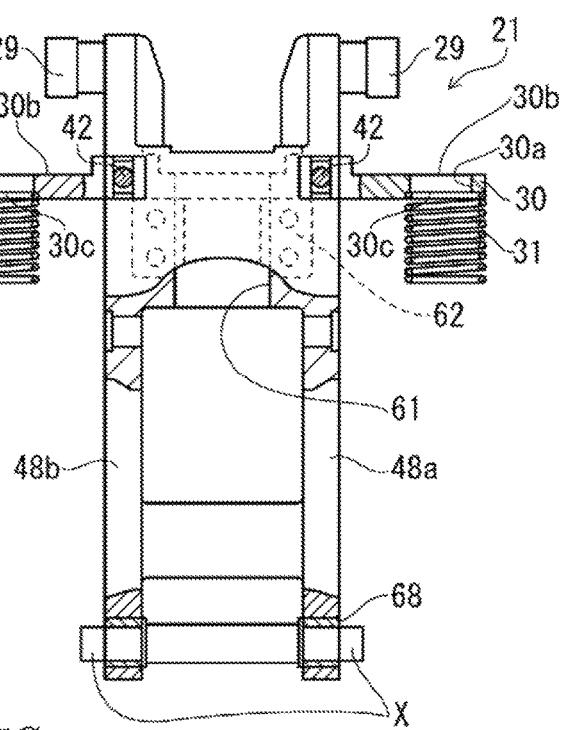
FIG. 5B is a partial sectional view of the valve body open/close drive body.
Figure 5C:
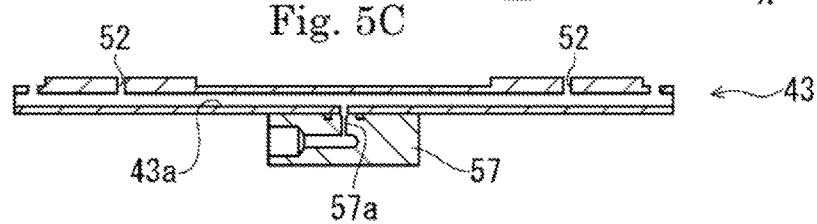
FIG. 5C is a sectional view of a cylinder base.

As depicted in FIGS. 2 and 3, at the lower position of the housing body 20 or the valve body open/close drive body 21 (21'), the stopper unit 33a (33b) which locks ascending of the valve body open/close drive body 21 (21') between the housing bodies 20 and a support X (Y) for a pendulum motion between the housing bodies 20 are provided. The stopper units 33a and 33b lock ascending in vertical movements of the valve body open/close drive body 21 (21') between the housing bodies 20 adjacent to both sides of the valve body open/close drive body 21 (21') by a motive power from an actuator. The support X (Y) is for a pendulum motion, which will be described further below, of the valve body open/close drive body 21 (21'). These stopper unit 33 and the support X (Y) may be provided to any of the valve body open/close drive body 21 (21') and the housing body 20, and any structure can be selected in accordance with the embodiment.

In FIG. 2, in the first embodiment, the longitudinally-elongated vertical-movement guide groove 32a is formed at a lower position of the housing body 20, and a support stopper 33a at an upper end of this vertical-movement guide groove 32a serves as the stopper unit 33. Also, a support rod X provided at a lower position of the valve body open/close drive body 21 serves as the support X in a pendulum motion, which will be described further below.

As depicted in FIG. 2, the vertical-movement guide groove 32a has both side surfaces serving as a guiding unit 32a', and is formed by notching the inner side surface of the housing body 20 (on a static side) upward from the bottom linearly by a valve stroke length $L_1$. An upper end of this groove serves as the stopper unit 33. This stopper unit 33 locks ascending of the support rod X, and serves as a portion where the support rod X swings in accordance with a pendulum motion of the valve body, as will be described further below. Thus, the vertical-movement guide groove 32a is notched in an arc shape so as to fit to the shape of the support rod X, and can also slidably guide the rotation of the support rod X with significantly less resistance. The support rod X (on a movable side) is suspended between two side plate units 48a and 48b at the lower portion of the valve body open/close drive body 21 via a bearing 68, with both ends protruding toward outer side surfaces, and these both ends engage with the support stoppers 33a.

In FIG. 3, in the second example, a support as a rod receiving unit Y is provided at a lower end of the valve body open/close drive body 21'. This rod receiving unit Y serves as the support Y in a pendulum motion, which will be described further below. Also, a stopper rod 33b provided to the housing bodies 20 serves as the stopper unit 33.

As depicted in FIG. 3, an escape portion 32b is formed by notching a side surface of each of the side plate units 48a' and 48b' (on the movable side) linearly by the valve stroke length $L_1$, preventing an interference of the stopper rod 33b with the valve body open/close drive body 21' at the time of ascending or descending and also reducing the weight of the valve body open/close drive body 21'. At lower ends of these escape portions 32b serve as the rod receiving unit Y. The stopper rod 33b (on the static side) has both ends fixed to hole portions 48 symmetrically provided on inner side surfaces of the housing bodies 20 on both sides. The rod receiving unit Y swings with respect to the stopper rod 33b with a pendulum motion of the valve body, which will be described further below, and thus has a receiving surface formed in an arc shape so as to fit to the shape of the stopper rod 33b. Also, the rod receiving unit Y can slidably guide the rotation of the stopper rod 33b with significantly less resistance.

As depicted in FIGS. 2, 3, and 8 to 10, the housing body 20 is provided with a piston rod 26 which vertically moves by a cylinder mechanism 25. The piston rod 26 has, at a bottom position, a seal member 54 which slidably seals a space between the piston rod 26 and an inner wall of a cylinder chamber 44 and a recess 26a where a gate lock mechanism is latched and locked. At an upper end, the piston rod 26 has an attachment shaft part 35 to which the cam member 27, which will be described further below, is fixedly attached. No component directly coupling and interlocking two piston rods 26 provided to the left and right housing bodies 20 is provided, and these piston rods 26 are independent from each other. This structure allows these piston rods 26 to be separately assembled at the time of assembling a gate valve, and also contributes to compactability of the gate valve and an improvement in component productivity. Note that a detection end 55 provided to the piston rod 26 is part of a sensor leading to a sensor detection plate, not depicted, for displaying a degree of valve opening from full-open to fully-closed, and a conduit pipe 56 coupled to the valve body open/close drive body 21 (21') is a guide member which guides a lead wire from a power supply to a cartridge heater or the like provided inside the valve body. The detection end 55 and the conduit pipe 56 are both provided so as to allow communication inside and outside the gate valve irrespective of an ascending/descending motion of the valve body open/close drive body 21.

Figure 8:
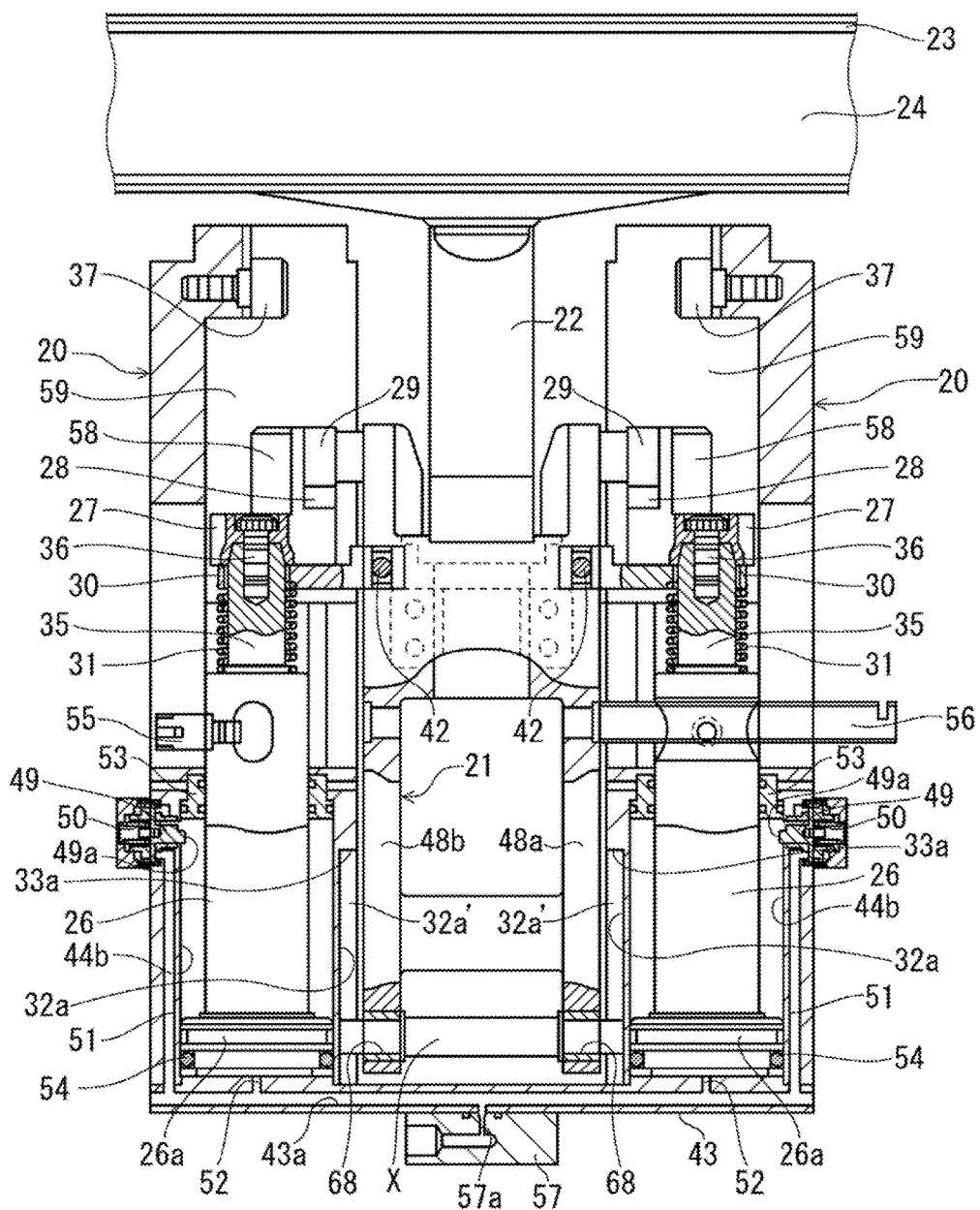
FIG. 8 is a sectional view of a partially notched portion depicting a state in which a valve body is at a lower position with the vacuum gate valve being in a full-open state.
Figure 9:
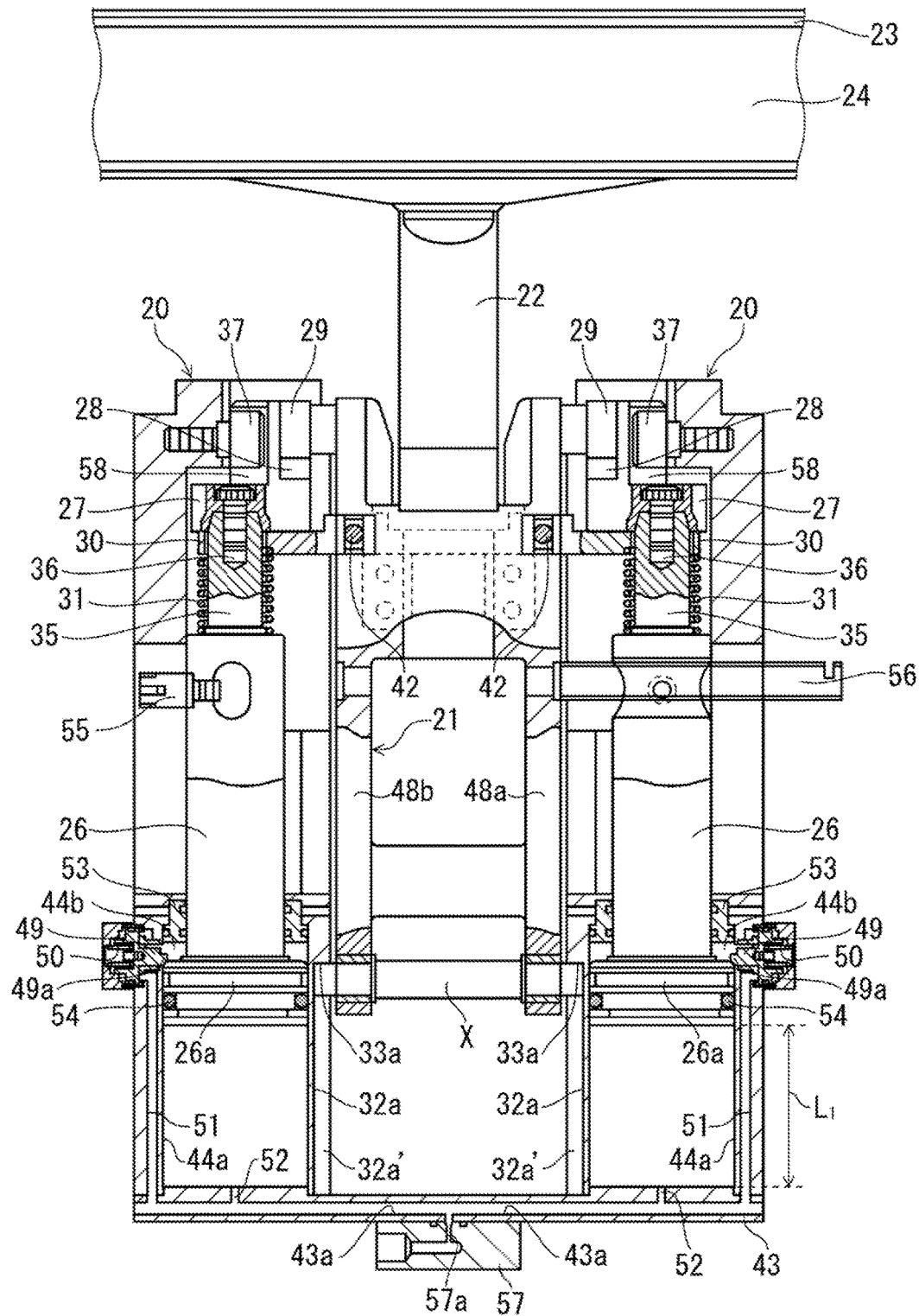
FIG. 9 is a sectional view of a partially notched portion depicting a state in which the valve body is at an upper position with the vacuum gate valve being in the full-open state.
Figure 10:
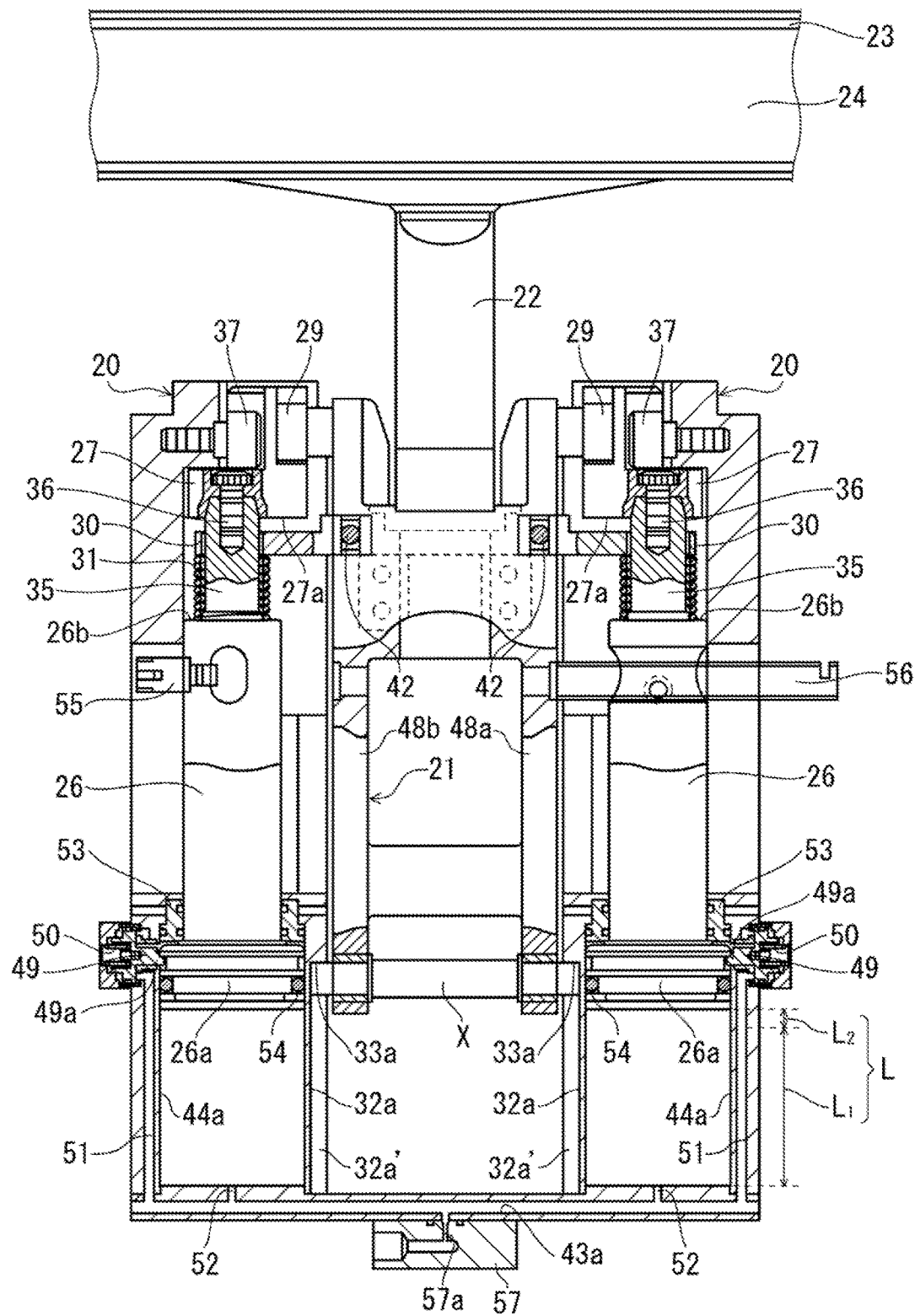
FIG. 10 is a sectional view of a partially notched portion depicting a fully-closed state of the vacuum gate valve.

In FIGS. 8 to 10, a cylinder base 43 is coupled to a lower portion of the housing bodies 20. This cylinder base 43 is provided with a flow path 43a which supplies and exhausts air, and this flow path 43a is coupled to the cylinder chamber 44 of a cylinder mechanism 25. The cylinder mechanism 25 is formed of an air supply source not depicted, a block body 57, a cylinder base 43, a flow path 51 provided inside the housing body 20 to communicate, in a fluid-tight manner, flow paths 43a and 52 provided to this cylinder base 43, the gate lock mechanism, which will be described further below, and cylinder chambers 44a and 44b.

In FIGS. 8 to 10, one cylinder base 43 is provided in common on the bottom of the paired housing bodies 20 laterally disposed, and is coupled to the bottom of the housing bodies 20 in a fluid-tight manner. Furthermore, the block body 57 is also coupled to the cylinder base 43, allowing the air supply source and the inner flow path 43a to communicate each other. The cylinder chamber 44a communicates with the flow path 43a of the cylinder base 43 via the flow path 52. With the inside of the cylinder chamber 44a filled with air at a predetermined pressure, the piston rod 26 is pushed up by fluid pressure. A space between the cylinder chamber 44b and the piston rod 26 is slidably sealed by the seal member 53. The inside of the cylinder chamber 44b communicates a cylinder chamber inside the gate lock mechanism via a communication path, which will be described further below, and further communicates the flow path 51 inside the housing body 20. With the inside of the cylinder chamber 44b filled with air at a predetermined pressure, the piston rod 26 is pushed down by fluid pressure.

As depicted in FIGS. 8 to 10, holes (such as the flow paths 52) for supplying and exhausting air in the cylinder base 43 are symmetrically provided in a lateral direction. Thus, two piston rods 26 provided inside the paired housing bodies 20 each have a non-coupled, independent structure, but can ascend and descend simultaneously in response to air supply and exhaust. Also, the piston rods 26 are coupled on the cylinder base 43 in a compact manner, also contributing to compactability of the cylinder mechanism 25. Furthermore, in accordance with the position of the air supply source, the arrangement of the gate valve, and so forth, it is possible to set a direction of the air supply port as appropriate by changing the orientation of the block body 57 attached to the center of the cylinder base 43, and also set an air supply speed (operation speed) as appropriate by using an orifice 57a.

In FIGS. 8 to 10, any gate lock mechanism capable of locking the piton rod 26 at a piston's top dead center position (fully-closed position) can be selected. In the first and second embodiments, the gate lock mechanism is a latch lock mechanism provided on an outer side surface of the housing body 20. As will be described by using FIG. 10, when the piston rod 26 is at the fully-closed position (top dead center position), air in the cylinder 44b is exhausted. A pin 49a of a piston 49 projects to a cylinder chamber 44b side by a pressing force of the spring 50 to fit in the recess 26a. Thus, even without air on the cylinder chamber 44a side, ascending/descending movements of the piston rod 26 can be latched and locked.

As depicted in FIGS. 4A, 5A to 5C, 7A, and 7B, the cam member 27 is fixed above the piston rod 26. In the first and second embodiments, with the attachment shaft part 35 provided above the piston rod 26 inserted through an opening 30a of the spring receiving unit 30, the cam member 27 and the attachment shaft part 35 are fixedly attached via a bolt 36. More specifically, in FIG. 7B, an upper end of the attachment shaft part 35 fits in a fit-in part 27b (recessed tapered shape) opening to a lower surface 27a side of the cam member 27, and the bolt 36 is screwed into a recess 27c opening to an upper surface side of the cam member 27 to be inserted into the attachment shaft part 35 for secure fixing. Thus, while the cam member 27 and the piston rod 26 are independent components, both are securely coupled and integrally movable.

Figure 7A:
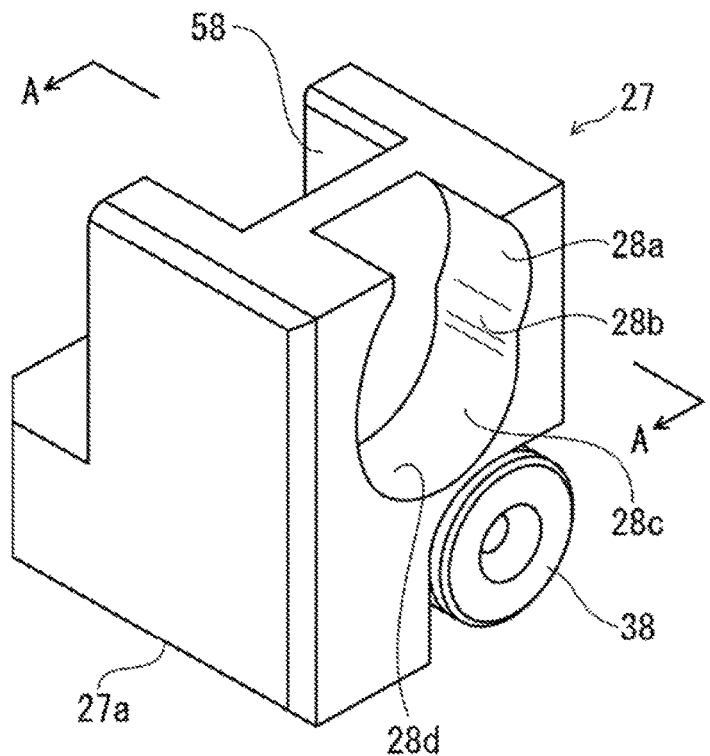
FIG. 7A is a perspective view of a cam member.
Figure 7B:
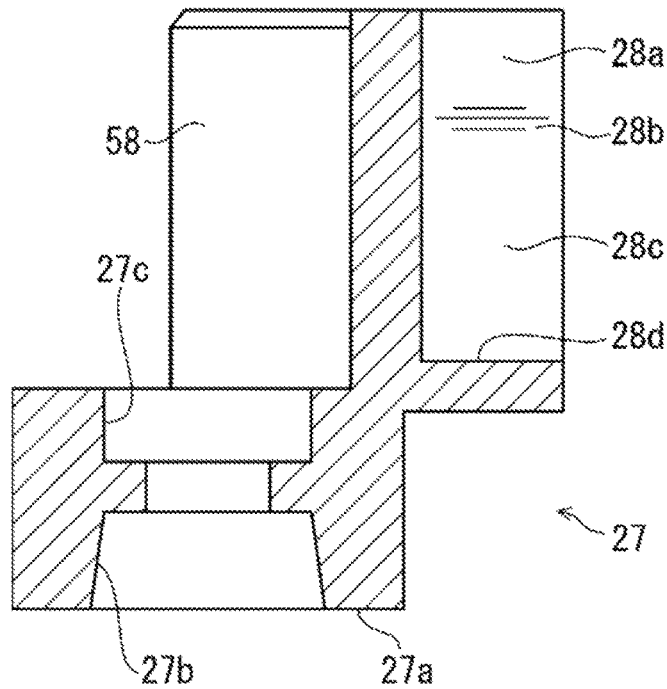
FIG. 7B is a sectional view along an A-A line of FIG. 7A.

As depicted in FIG. 7A, a long cam groove 28 is formed in the cam member 27. This cam groove 28 is a groove notched and curved in a substantially doglegged shape so as to have a width having a diameter slightly larger than that of a cam roller 29, which will be described further below. Along a groove direction, the cam roller 29 is formed so as to be freely movable in a loose-fit manner. In the cam groove 28, an arc-shaped engaging part 28a is formed at an upper end, a projecting convex surface part 28b is formed at an intermediate portion, an arc-shaped locking part 28c is formed at a lower position, and an arc-shaped arc surface 28d is formed at a lower end.

As depicted in FIGS. 2, 3, 5A to 5C, 7A, 7B, and 8 to 10, cam receiving rollers 37 and 38 for guiding the cam member 27 ascending/descending in the housing body 20 are attached. As depicted in FIGS. 8 to 10, the cam receiving roller 37 is attached at an upper end in the housing body 20. When the cam member 27 is positioned near the upper end in the housing body 20, the cam receiving roller 37 is accommodated in a loose-fit manner in the roller receiving unit 58 notched in a rectangular shape depicted in FIG. 7A to rotate and make contact with the inner side surface or the bottom surface of this roller receiving unit 58, thereby allowing the operation of the cam member 27 to be guided.

As depicted in FIG. 7A, the cam receiving roller 38 is attached to a bottom surface side of the cam member 27 with a diameter to the extent of not projecting from the cubical cam member 27 to a lower surface 27a side. When the cam member 27 ascends or descends in the housing body 20, the cam receiving roller 38 rotates and makes contact with an inner side surface 59, thereby allowing the operation of the cam member 27 to be guided.

In place of the cam receiving rollers 37 and 38, a plastic-made thrust bearing may be provided as appropriate on an inner side surface side (such as the inner side surface 59) of the housing body 20 where the cam member 27 slidably makes contact and slidably moves when ascending or descending, and ascending or descending movements of the cam member 27 inside the housing body 20 may be guided by this thrust bearing. The cam receiving rollers 37 and 38 allow the cam member 27 to smoothly ascend and descend in a stable state.

As depicted in FIGS. 8 to 10, with the valve body open/close drive body 21 being disposed between the housing bodies 20 laterally disposed and the spring receiving unit 30 being disposed below the cam member 27, the gate valve of the present invention includes the spring 31 resiliently supported between the spring receiving unit 30 and the piston rod 26. The resilient force of this spring 31 causes the valve body 24, the stem 22, and the valve body open/close drive body 21 to become in a lifted state, with the spring receiving unit 30 taken as a point of load. Also, the contact surface 30b becomes in a state of being pressed to make contact with the lower surface 27a. Specifically, the spring 31 fitting in the attachment shaft part 35 has an upper end in contact with a circular recess 30c at the spring receiving unit 30 and the other end in contact with a shoulder unit 26b of an upper end of the piston rod 26, thereby being resilient in a direction of spreading a space between these circular recess 30c and shoulder unit 26b.

As depicted in FIGS. 2, 3, 4A, 4B, 5A to 5C, and 6, for example, above each valve body open/close drive body 21 (21'), the cam roller 29 (29') to be guided to the cam groove 28 so as to be swingable is provided. As depicted in FIG. 11, in a use state of the gate valve of the present invention, the cam roller 29 engages with the cam groove 28 in a loose-fit state with a slight slack and, rotates and slidably moves along a direction of this cam groove 28 almost without resistance by a very small dynamic friction force between the cam groove 28 and the cam roller 29, thereby being allowed to be guided to the cam groove 28.

Figure 12A:
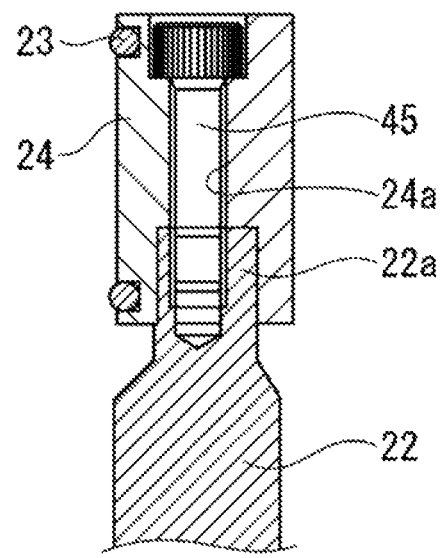
FIG. 12A is a sectional view depicting an integrated valve body portion.

As depicted in FIGS. 2 and 3, for example, the stem 22 is fixed above the valve body open/close drive body 21 (21'). An upper end of this stem 22 includes a long valve body having a valve body seal member 23. Also as depicted in FIGS. 12A and 12B, the upper end of the stem 22 is fixedly attached to a center position of the valve body 24 with a bolt 45.

As depicted in FIGS. 4B, 5A to 5C, and 8 to 10, the lower end of the stem 22 fitting in a fit-in part 61 provided at an axial center part of the valve body open/close drive body 21 is sandwiched and fixed as being covered with a sandwiching member 62 capable of bolt-fixing to the valve body open/close drive body 21. Also, as depicted in FIG. 12A, an upper end 22a of the stem 22 and a center position 24a of the valve body 24 are fixedly attached with the bolt 45, and thus the stem 22 and the valve body 24 is an integrated valve body without a valve body support. Thus, the valve body 24, the stem 22, and the valve body open/close drive body 21 do not have a swing mechanism or the like, and are integrally provided without a slidable movement or swing of coupling units.

Figure 12B:
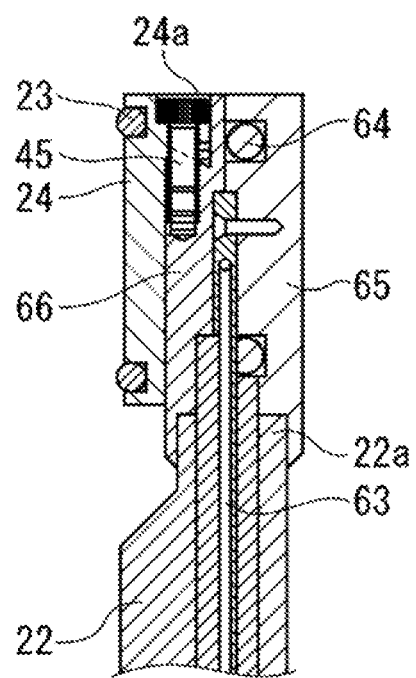
FIG. 12B is a sectional view depicting an example of a heater heating valve body.
Figures 14A, 14B, 14C:
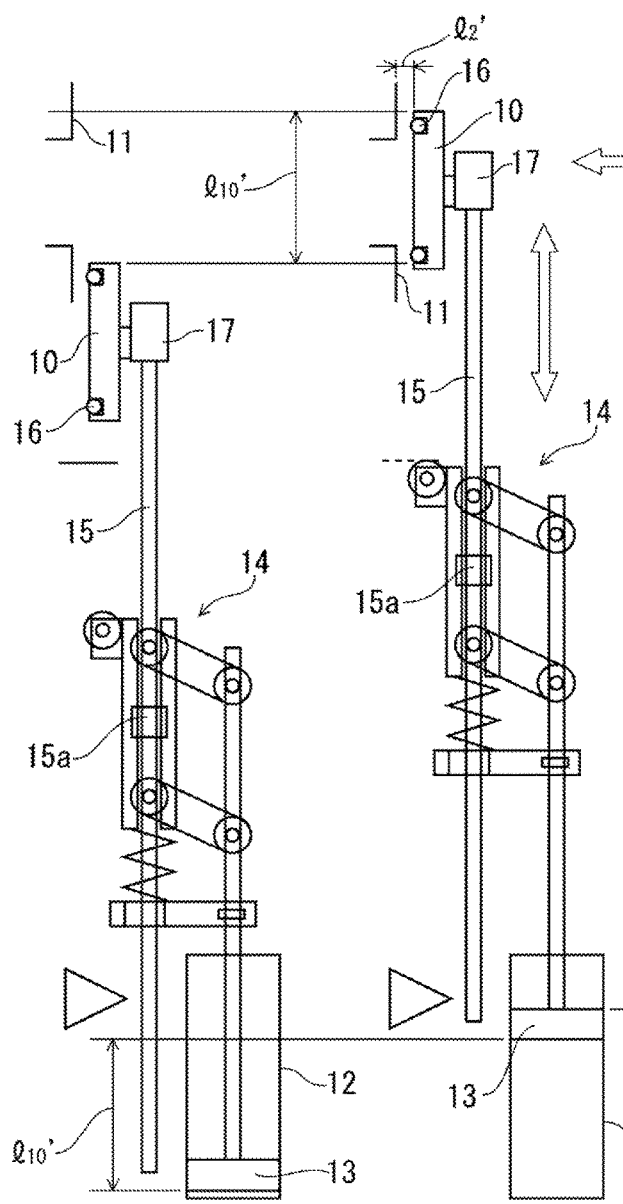
FIG. 14A to FIG. 14C are conceptual diagrams depicting another example of the conventional vacuum gate valve for concept description.

As depicted in FIG. 12B, a heater-incorporated structure may be adopted as another structure of the valve body 24. In this structure, a lead wire 63 communicating a power supply not depicted is incorporated in a stem 22b, and this lead wire 63 is electrically connected to a cartridge heater 64. The cartridge heater 64 is provided in a groove provided in a support member 65 coupled to the back surface of a valve body 24 and having the same shape as the long rectangular shape of the valve body 24, thereby being capable of uniformly heating the valve body 24. To the support member 65 provided with the cartridge heater 64 in the groove, a seal plate 66 is fixedly attached by full-circled welding, and the cartridge heater 64 is hermetically incorporated between the support member 65 and the seal plate 66. The valve body 24 and the seal plate 66 are fixedly attached with the bolt 45.

Figure 1A:
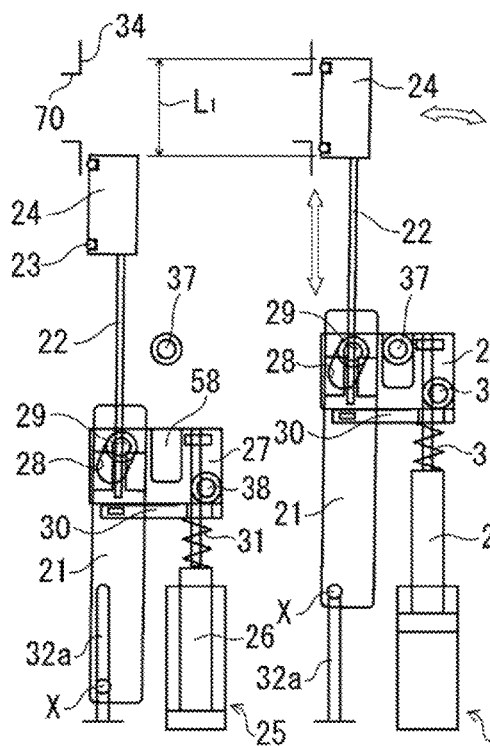
FIG. 1A to FIG. 1D are conceptual diagrams each depicting an activated state of a vacuum gate valve in the present invention.

Next, the operation of the gate valve of the present invention is described in detail based on the drawings. FIGS. 1A, 8, and 11A each depict a valve full-open state. The valve body 24 is away from a valve seat 34 (flow path position) and completely hidden below, and the piston rod 26 is positioned at a bottom dead center.

Figure 1B:
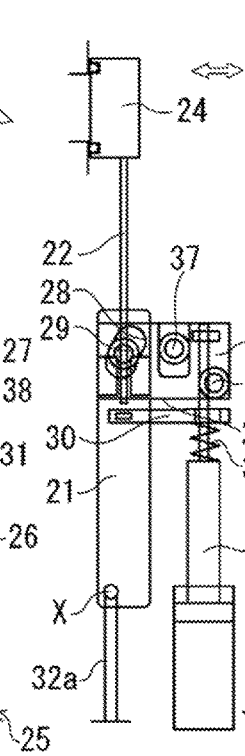

In the above-described valve full-open state, firstly, air from the air supply source passes from the block body 57 through the flow paths 43a and 52 of the cylinder base 43 to flow into the cylinder chamber 44a inside the housing body 20. With an increase in pressure inside the cylinder chamber 44a, the piston rod 26 is pushed up by fluid pressure to ascend and the valve body 24 reaches a position of closing a flow path 70. This state in which the valve body 24 reaches the position of closing the flow path 70 is depicted in FIGS. 1B, 9, and 11B. Until then, the lower surface 27a of the cam member 27 and the contact surface 30b of the spring receiving unit 30 are in a state of being pressed in surface contact, and the piston rod 26 ascends within a valve stroke $L_1$ depicted in FIG. 9. The same goes for valve-opening (descending) operation.

During this period (in which the piston rod 26 is ascending or descending in the range of the valve stroke $L_1$), the upper end of the spring 31 resiliently pushes the recess 30c of the spring receiving unit 30 upward to lift the valve body open/close drive body 21. Here, if the contact surface 30b is in linear contact with the lower surface 27a (the cam receiving roller 38) as being tilted, the valve body open/close drive body 21 has a degree of flexibility capable of slight rotation about the spring receiving unit 30 to cause rotation moment for the contact surface 30b to make flat contact with the lower surface 27a for stabilization.

On the other hand, in the valve-closing operation of the gate valve of the present invention is of a so-called J operation type, in which the valve body 24 is delivered from the full-open position below the flow path 70 to the flow path position and the valve body 24 is caused to make pendulum movements to completely close the flow path 70. Thus, during this period (in the range of the valve stroke $L_1$), it is required to retain a valve-opening orientation in which a seal surface formed by the valve body seal member 23 of the valve body 24 is slightly tilted with respect to a valve seat surface formed by the valve seat 34.

This valve-opening orientation can be retained by locking the above-described rotation by taking the spring receiving unit 30 as an axial center. By adjusting the angle of the spring receiving unit 30, flat contact between the contact surface 30b and the lower surface 27a is allowed in advance and rotation flexibility is completely eliminated in advance, thereby reliably retaining the valve-opening orientation and also stabilizing ascending/descending operation of the valve body open/close drive body 21. For example, when the flow path 70 is oriented to a horizontal direction and a swing angle of pendulum motion, which will be described further below, in a valve-open state is 0.3 degrees from a vertical direction, if the contact surface 30b of the spring receiving unit 30 and the lower surface 27a of the cam member 27 being in surface contact are fixedly attached together via the set screw 42, the spring receiving unit 30 can be attached and fixed as being tilted by 0.3 degrees with respect to an axial-center vertical direction of the valve body open/close drive body 21 (21').

Also, in ascending and descending in this range of the valve stroke $L_1$, the structure in the first embodiment depicted in FIG. 2 is such that the support X of the valve body open/close drive body 21 can ascend and descend as being guided by a guiding unit 32a' of the vertical-movement guide groove 32a. This guiding unit 32a' reliably stops a swing of the support X and reliably prevents a swing of the valve body open/close drive body 21 to the flow path direction. In this manner, in the valve body open/close drive body 21 in the first embodiment, at an upper position, the spring 31 causes the spring receiving unit 30 to reliably press-fit toward the cam member 27. At a lower position, the support X is reliably guided by the guiding unit 32a' of the vertical-movement guide groove 32a, and also the thrust bearing 69 provided on each side surface reliably makes contact with the inner side surface 20a of the housing body 21 to be guided. Thus, the valve body open/close drive body 21 is configured to be able to achieve ascending, descending, or making a pendulum motion with high stability as being kept in a state of being reliably retained at the center position between two housing bodies 20 on both sides.

On the other hand, in the second embodiment depicted in FIG. 3, while the valve-opening orientation retaining structure by the spring receiving unit 30 and the guide structure by the thrust bearing 69 are in common, the guide structure such as the guiding unit 32a' is not provided at a lower position of the valve body open/close drive body 21', and the valve-open orientation retaining structure for the valve body open/close drive body 21' depends on the contact and pressuring of the contact surface 30b of the spring receiving unit 30, which can be easily provided by the structure of the first embodiment in FIG. 2. Thus, the first or the second embodiment is selected as appropriate in accordance with implementation.

When the piston rod 26 reaches the top dead point of the valve stroke $L_1$, the support X, Y of the valve body open/close drive body 21 is locked at the stopper unit 33 to cause ascending to be stopped. In the first embodiment, the support rod X is locked at the support stopper 33a and the rod receiving unit Y is locked at the stopper rod 33b, thereby stopping ascending of the valve body open/close drive body 21.

Figure 1C:
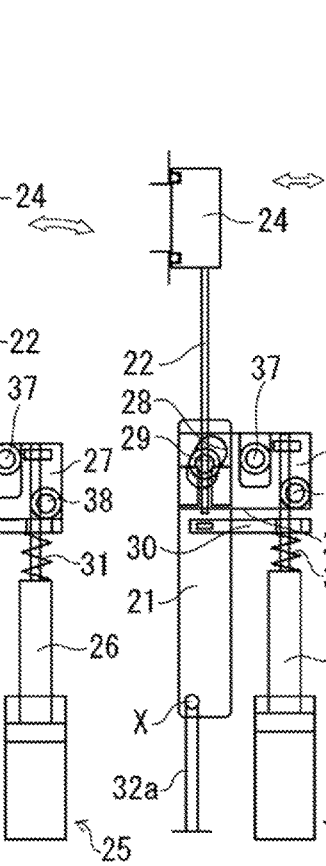

Next, operation of pushing the valve body 24 onto the valve seat 34 to completely close the flow path 70 is described. During this operation, the piston rod 26 ascends and descends in the range of a cam actuation stroke $L_2$. FIGS. 1C and 11C each depict a state in the course of operation in the range of this stroke $L_2$.

A valve-closing operation in the range of the above-described cam operation stroke $L_2$ is performed by a pendulum motion of the valve body 24 by taking the cam roller 29 as a point of effort and the valve body 24 as a point of load with respect to the support (the support rod X in the first embodiment and the rod receiving unit Y in the second embodiment) provided at the lower-end position of the valve body open/close drive body 21. That is, from the top dead point of the valve stroke $L_1$ depicted in FIGS. 1B, 9, and 11B described above, the piston rod 26 further ascends to cause the cam roller 29 to be pressed to a direction of the flow path 70 while causing the spring 31 to be shrunk, and the valve is closed while a pendulum motion is performed by taking the stopper unit 33 as a fulcrum.

Specifically, the support X (support rod X) of the first embodiment is swingably engaged with the support stopper 33a, and the support Y (rod receiving unit Y) of the second embodiment is swingably engaged with the stopper rod 33b, thereby locking ascending of the valve body open/close drive body 21 (21'). In this stop state, the cam member 27 further continues ascending while causing the spring 31 to contract against its resilient force. Here, the cam roller 29 in an ascending-locked state slides and rotates almost without resistance so as to ascend from the ascending engaging part 28a of the cam groove 28 to override the convex surface part 28b. With this overriding motion over this convex surface part 28b, the valve body open/close drive body 21 is being fallen down so as that the valve body open/close drive body 21 is rotated and tilted toward the direction of the flow path 70, with the cam roller 29 (29') taken as a point of effort and the stopper unit 33 as a fulcrum (in FIGS. 8 to 10, the valve body open/close drive body 21 is slightly tilted in a vertical direction on the paper). This tilted motion causes the valve body 24 (point of load) to make a pendulum motion from the valve-open orientation toward the valve seat 34 at a slightly swing angle.

Figure 1D:
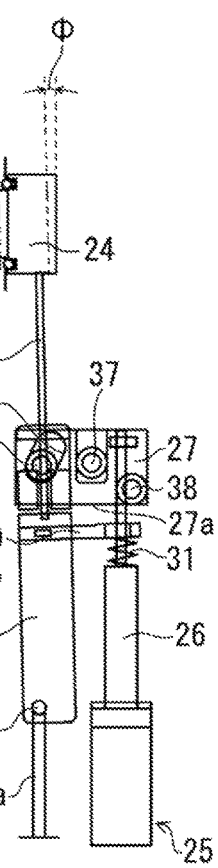

FIGS. 1D, 10, and 11D each depict a state in which the valve body 24 is pressed onto the valve seat 34 to completely close the flow path 70. In this state, the cam roller 29 (29') overrides the convex surface part 28b in the cam groove 28 to be locked near a locking part 28c. By causing the cam member 27 to further ascend (to the upper limit of the cam actuation stroke $L_2$), the cam roller 29 can move from the locking part 28c to the arc surface 28d, and when moved to the arc surface 28d, the stem 22 is slightly warped, and a force acts in a direction in which the valve body open/close drive body 21 (valve body 24) is further swung by taking the stopper unit 33 as a fulcrum, thereby further increasing the pressing force onto the valve seat 34.

Any shape which guides the cam roller 29 (29') to fall down the valve body open/close drive body 21 by the above-described pendulum motion can be selected for the cam groove 28 in accordance with implementation. Also, when the valve is completely closed within the cam actuation stroke $L_2$, a load nearly twice as much as a valve-body closing load acts on the lower surface 27a of the cam member 27, thereby causing a force in a horizontal direction to be acted onto the cam member 27 and possibly causing a failure in smooth ascending or descending. Thus, the cam receiving rollers 37 and 38 are provided, and the roller 37 can rotate and make contact with the inner side surface of the roller receiving unit 58 and the roller 38 can make contact with an inner side surface 59 of the housing body 20. Thus, the housing body 20 can smoothly and stably guide ascending and descending of the cam member 27.

The latch lock piston 49 of the gate lock mechanism is provided at a predetermined position in the range of the cam actuation stroke $L_2$ of the housing body 20 so as to be able to lock ascending and descending of the piston rod 26 at a position corresponding thereto when the valve body 24 is caused to make a pendulum motion to have a predetermined swing angle (in a valve-seat closing state). Specifically, as depicted in FIGS. 1D, 10, and 11D, when the piston rod 26 ascends to a predetermined height to causes a predetermined closing state, the pin 49a of the piston 49 provided at this position projects to the recess 26a to cause the piston rod 26 to be latched and locked at this position. Even if air is exhausted from the cylinder chamber 44a, this latch locking locks descending of the piston rod 26, and the predetermined closing state of the valve body 24 with respect to the valve seat 34 is retained.

As described above, with ascending of the valve body open/close drive body 21 (21') being locked by the stopper unit 33 and the valve body open/close drive body 21 (21') being lifted by the resilient force of the spring 31, the ascending force of the cam member 27 by the piston rod 26 is converted into a motion of the cam roller 29 (29') along the cam groove 28. The motion of the cam roller 29 causes the valve body open/close drive body 21 with the stem 22 and the valve body 24 to be integrally rotated (tilted) as a whole by taking the support (X, Y) as a center. In this rotation motion (pendulum motion), the support (X, Y) is at a lower end position of the valve body open/close drive body 21, and thus a span of a pendulum motion is from the valve body 24 at the upper end to the support at the bottom end. Unlike the related art, a pendulum span is allocated as a maximum length. Thus, a required tilted angle of the valve body 24 required when the valve body 24 is pressed onto the valve seat 34 to completely close the valve can be made significantly small compared with the related art under the same conditions. Thus, the amount of warpage of the stem 22 when the valve is completely closed is also small, and a twist or rubbing that can occur to the valve body seal member 23 when the valve seat 34 is pressed is also small, thereby allowing an occurrence of particles at the time of valve closing to be significantly inhibited.

Specifically, in a structure as depicted in FIGS. 13A to 13C and 14A to 14C in which an intermediate position 5a, 15a of the stem is pressed toward the flow path direction (horizontally) to completely close the valve, for example, if the stem has the same thickness, a length (from a support Z to the valve body) of 330 mm, and a compression range of the valve-body seal member of 0.2 mm to 1.0 mm, warpage of the stem is 0.8 mm, a tilted angle (θ, θ') of the valve body with respect to the body seal surface 2, 11 is 0.3 degrees in these conventional structures. On the other hand, in the gate valve of the present invention under the same conditions, the required tilted angle of the valve body 24 with respect to the valve seat 34 required to completely close the valve is Φ=0.14 degrees, as depicted in FIG. 1D. Thus, the valve body 24 is not tilted to a degree in the related art, and thus the occurrence of particles between the valve body seal member 23 and the valve seat 34 is significantly inhibited.

Furthermore, when the intermediate position 5a, 15a of the stem is pressurized as in the related art of FIGS. 13A to 13C and 14A to 14C, the stem is being warped by taking a portion of the valve body 1, 10 near a lower end side as a starting point, and a force of peeling off a portion near an upper end side from the body seal surface 2, 11 acts. Thus, a twist or rubbing due to complete closing of the valve body 1, 10 by the valve body seal member tends to occur. On the other hand, in operation of completely closing the valve body 24 according to the present invention, the valve body 24, the stem 22, and the valve body open/close drive body 21 integrally performs a rotation motion by taking the support as the center. Thus, at least in a slight rotation range (swing angle range of a pendulum motion) for completely closing the valve body 24, the valve body 24 and the valve seat 34 are kept as being nearly in a parallel state, even if the stem 22 is warped. Thus, according to the present invention, the occurrence of a twist or rubbing of the valve body seal member 23 can be significantly inhibited.

Also, the above-described pendulum motion is performed with the spring receiving units 30 symmetrically attached on both sides of the valve body open/close drive body 21 being lifted by two springs 31 from a lateral direction. Compared with a gate valve in a structure as in the related art in which the axial center portion of the valve body open/close drive body is lifted by only one spring, high stability and accuracy of the pendulum motion can be achieved.

In addition, the cam member 27 serves as a point of effort for valve opening and closing. Thus, the action of the rotation moment required to swing the stem 22 (valve body open/close drive body 21) is smaller as the cam member 27 is closer to the valve body 24. However, as described above, it is configured that the action of the point of effort of the pendulum motion by the cam member 27 occurs in the range of the cam actuation stroke $L_2$ near the upper end of the housing body 20, and thus a driving force required for the cam member 27 ascending and descending in this range can be minimized. Also, a force in the horizontal direction may act on the cam member 27 and the piston rod 26 as described above to cause a deformation or a failure in ascending or descending. However, these components are accommodated inside the sturdy housing body 20, and thus reliable ascending and descending can be secured while durability against the above-described force in the horizontal direction is enhanced. Also, high durability can be ensured even if the housing body 20 is made thin and compact.

In the gate valve of the present invention, as described above, the valve body 24 and the stem 22 are of an integrated type. As depicted in FIGS. 1, 11A to 11D, and so forth, the valve seat 34 and the valve body 24 are set to be parallel to each other at a position where the valve body seal member 23 makes contact with the valve seat 34, and the valve body seal member 23 is fastened and compressed to warp the stem 22 to completely close the valve body seal member 23 so that the valve body seal member 23 and the valve seat 34 are nearly parallel to each other.

The settings as described above can be made as appropriate by setting a fixing angle of the valve body 24 with respect to the stem 22, an arrangement relation of the gate valve with respect to a direction or position of the flow path 70, and a combination thereof. In the gate valve of the present invention, as depicted in FIGS. 11A to 11D, the position of the support (X, Y) of the valve body open/close drive body 21 is set so as to be straight below the valve seat 34 on a valve box side to be pressed and completely closed by the valve body seal member 23 of the valve body 24, as depicted in FIGS. 11A to 11D.

If the support (X, Y) is at a position straight below the valve seat 34, when the valve body 24 makes a pendulum motion, the valve seat 34 naturally serves as an apex position of this pendulum motion even if the valve body 24 is fixed in parallel to the stem 22, and the valve body 24 is secured to be seated on the valve seat 34. Also, a displacement in ascending and descending of the valve body 24 by a pendulum motion can be minimized.

Here, generally speaking, the amount of warpage (amount of bending deformation) of a stiff member increases as the length (length in a beam axis direction perpendicular to a warpage direction) of the member increases, if a warping force is the same. Thus, to decrease the amount of warpage, the shorter the length of the member is better. By contrast, when the valve seat and the valve body are set so as to be parallel to each other at a position where the valve body seal member makes contact with the valve seat and a member for fastening the valve body to the valve seat (the valve body open/close drive body and the stem part) are warped as a whole to fasten and compress the valve body seal member to completely close the valve body seal member nearly in parallel to the valve seat, the amount of warpage is minimized, thereby attaining a balance among the compression displacement amount of the valve body seal member, the amount of warpage of the stem part, and the valve fastening load and allowing the valve body to be fastened to the valve seat nearly parallel to the valve seat. On the other hand, when the amount of warpage of the stem part is the same, if the stem part is thin, the closing load of the valve body cannot be set large. If the stem part is thick, the stem part is difficult to warp to cause the valve body to be diagonally fastened to the valve seat. Thus, a less amount of warpage of the stem part is better. From these, the amount of warpage of the stem part is more advantageous if the amount of warpage of the stem part is set smaller. Thus, the stem part is preferably provided to have a length as short as possible.

As for this, in the present invention, as described above, the valve body open/close drive body 21 and the stem 22 serve as members which fasten the valve body 24 to the valve seat 34 at the time of valve closing, and the valve body open/close drive body 21 is configured of a rigid body in which warpage substantially does not occur with a load which acts at the time of valve closing. Thus, a warped member is substantially only the stem 22. Also, the lower end pf the stem 22 is firmly fixed at an upper position substantially close to the valve body 24 of the valve body open/close drive body 21. Therefore, the structure of the present invention is such that substantially only the stem 22 warps at the time of valve closing, and the length of this stem 22 (distance between the valve body open/close drive body 21 and the valve body 24) is minimized as required. Thus, the amount of warpage at the time of valve closing can also be minimized.

In addition, at the time of valve closing, the cam groove 28 (cam member 27) ascends to move the ascending-locked cam roller 29 (valve body open/close drive body 21) to tilt the valve body 24. Thus, the valve closing operation is determined in accordance with the shape and length of the cam groove 28. In particular, as the amount of warpage of the stem 22 is smaller, the amount of deviation caused by a swing of the cam roller 29 in the cam groove 28 is smaller. Thus, since the amount of warpage of the stem 22 is minimized in the present invention, the amount of deviation of the cam roller 29 is also decreased, and the driving force (ascending force) required for the cam member 27 (piston rod 26) is also decreased. This contributes to a reduction in size of the piston rod 26 (cylinder mechanism 25) and, in turn, allows a reduction in size of the gate valve of the present invention.

The valve body seal member 23 is provided by vulcanized adhesion to a predetermined groove, not depicted, formed in the surface of the valve body 24, has a volume larger than that of this groove, and a projecting amount is on the order of 1 mm. Also, even if fastening is made with a load obtained by adding a counterpressure load of the valve body 24 to a compression force of the valve body seal member 23 or more, the valve body seal member 23 is not broken and withstands the contact pressure, and a gap on the order of 0.2 mm to 0.3 mm can be kept between the valve seat surface (body seal surface) of the valve seat 34 and the valve body 24. Also, other than the structure described above, the valve body seal member 23 may be configured such that a predetermined O ring is attached to a dovetail groove structure, although the amount of occurrence of particles is increased.

Described next is a valve-opening operation from the above-described valve-closing state in which the valve body seal member 23 is pressed onto the valve seat 34 to peel off the valve body seal member 23 to open the valve. At the time of valve opening, the lock of the gate lock mechanism is released to release the locked state of the piston rod 26. The gate lock mechanism of the present invention is configured such that air can go through a cylinder chamber of the latch lock piston 49.

When air is supplied from the cylinder base 43 via the flow path 51 to the cylinder chamber of the latch lock piston 49, the piston 49 is pulled up against a pressing force of the spring 50. Here, although not depicted, the piston 49 is provided with a communication path capable of communicating the cylinder chamber of the piston 49 and the cylinder chamber 44b of the housing body 20. By pulling-up of the piston 49, this communication path opens on a cylinder chamber side of the piston 49. With this opening, the cylinder chamber of the piston 49 and the cylinder chamber 44b of the housing body 20 communicate to supply air. Thus, by pulling-up of the piston 49, the pin 49a comes off from the recess 26a to reliably release the lock of the piston rod 26. Then, with air supplied to the cylinder chamber 44b, the piston rod 26 starts descending (valve-opening operation).

By contrast, in the conventional structure in which air supply to the cylinder chamber of the housing body and air supply to the cylinder chamber of the latch lock piston are simultaneously performed, before the engagement of the pin of the latch lock piston with the piston cylinder is completely released, a motive force acts on the piston rod due to a pressure increase by air supply to the cylinder chamber of the piston rod, and the load of the piston rod may be exerted onto the latch lock pin to disable operation of the piston rod. This problem does not occur in the above-described structure of the present invention.

When the engagement of the piston rod 26 is released by the latch lock piston 49 as described above, the piston rod 26 starts descending, and the cam member 27 also descends accordingly. Subsequently, the valve-opening operation basically proceeds in a reversed manner of the series of valve-closing operation described above. In particular, in the range of the cam actuation stroke $L_2$, the valve body 24 makes a pendulum motion of moving only in a direction of opening the valve (flow path direction) while being retained at the flow path position. Thus, even if the valve body 24 is attached to the valve seat 34, the valve body 24 is opened nearly in a horizontal direction. Thus, as with the valve-closing operation, also at the time of valve-opening operation, a twist or rubbing does not occur between the valve body 24 and the valve seat 34, the occurrence of particles is significantly decreased.

Furthermore, the present invention is not limited to the description of the above-described embodiments, and can be variously modified in a range not deviating from the gist of the present invention described in the claims of the present invention.

What is claimed is:

1. A vacuum gate valve controlling the opening and closing of a flow path, the vacuum gate valve comprising: two longitudinally-elongated housing bodies opposingly disposed, the housing bodies each comprising a piston rod movable in a longitudinal direction, and a cam member fixedly attached to an upper portion of the piston rod and having a cam groove; a valve body open/close drive body provided between the two longitudinally-elongated housing bodies, the valve body open/close drive body comprising on each of the both sides: a cam roller at an upper portion of the valve body open/close drive body, the cam roller guided to the cam groove of the housing bodies so as to be able to swing; a spring receiving unit positioned below the cam roller and disposed at a lower portion of the cam member; and a spring resiliently supported between the spring receiving unit and the piston rod; a stem fixed to an upper portion of the valve body open/close drive body; and an elongated rectangular-shaped valve body located at an upper end of the stem, wherein the elongated rectangular-shaped valve body comprises a valve body seal member, wherein a lower position of each of the longitudinally-elongated housing bodies and the valve body open/close drive body have portions of a stopper unit for limiting ascension of the valve body open/close drive body between the longitudinally-elongated housing bodies, and a support structure engaged with the stopper unit and rotatable within the stopper unit, wherein as the piston rod ascends, the support structure engages with the stopper unit, and as the piston rod continues to further ascend, the piston rod causes the cam roller to be pushed in direction of the flow path, wherein the flow path is closed by a pendulum motion of the valve body open/close drive body with the cam roller taken as an external force and the stopper unit as a fulcrum, wherein the pendulum motion rotates the elongated rectangular-shaped valve body at the end of the pendulum motion towards an opening of the flow path, providing pressure that closes the flow path.

2. The vacuum gate valve according to claim 1, wherein the elongated rectangular-shaped valve body is transverse to the valve body open/close drive body and two longitudinally-elongated housing bodies.

3. The vacuum gate valve according to claim 1, wherein the valve body open/close drive body has a rigid structure that is not warped when a load at valve closing acts.

4. The vacuum gate valve according to claim 1, further comprising an attachment shaft part provided above the piston rod, the attachment shaft part being inserted through an opening of the spring receiving unit, wherein the cam member and the attachment shaft part are fixedly attached via a bolt.

5. The vacuum gate valve according to claim 4, wherein the spring fitting in the attachment shaft part has an upper end in contact with the spring receiving unit and an another end in contact with an upper end of the piston rod.

6. The vacuum gate valve according to claim 1, wherein the spring receiving unit is rotatable along the valve body open/close drive body so as to allow angular adjustment.

7. The vacuum gate valve according to claim 6, further comprising a rotation shaft having a rotation groove in the spring receiving unit, the rotation shaft being inserted into an insertion hole in the valve body open/close drive body, wherein the rotation groove is rotatably guided with a set screw fixedly attached to the valve body open/close drive body.

8. The vacuum gate valve according to claim 1, wherein a vertical-movement guide groove is formed at a lower position of the longitudinally-elongated housing body, a support stopper at an upper end of the vertical-movement guide groove is provided to serve as the stopper unit, and the support structure is a support rod.

9. The vacuum gate valve according to claim 1, wherein the support structure is a rod receiving unit that is provided at a lower end of the valve body open/close drive body, and the stopper unit is a stopper rod provided along the longitudinally-elongated housing bodies.

10. The vacuum gate valve according to claim 1, wherein a cylinder base is coupled to a lower portion of the longitudinally-elongated housing body, the cylinder base is provided with a second flow path which supplies and exhausts air, and the second flow path communicates a cylinder chamber of a cylinder mechanism.

11. The vacuum gate valve according to claim 1, wherein an upper end of the stem is fixedly attached at a center position of the elongated rectangular-shaped valve body via a bolt.

12. The vacuum gate valve according to claim 1, wherein a position of the support structure of the valve body open/close drive body is set so as to be straight below a valve seat to be pressed and completely closed by the valve body seal member of the elongated rectangular-shaped valve body.

* * * * *